US012677480B2

(12) United States Patent
Kim et al.

(10) Patent No.: US 12,677,480 B2
(45) Date of Patent: Jul. 7, 2026

(54) DISPLAY DEVICE AND METHOD OF DRIVING THE SAME

(71) Applicant: Samsung Display Co., LTD., Yongin-si (KR)

(72) Inventors: Kwang-Min Kim, Seoul (KR); Kiwook Kim, Hwaseong-si (KR); Wonkyu Kwak, Seongnam-si (KR); Do Yeon Hwang, Seoul (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 457 days.

(21) Appl. No.: 18/306,349

(22) Filed: Apr. 25, 2023

(65) Prior Publication Data

US 2023/0411405 A1     Dec. 21, 2023

(30) Foreign Application Priority Data

Jun. 16, 2022     (KR) ........................ 10-2022-0073594

(51) Int. Cl.
| | |
|---|---|
| *H01L 27/12* | (2006.01) |
| *G09G 3/32* | (2016.01) |
| *H01L 29/66* | (2006.01) |
| *H10D 30/67* | (2025.01) |
| *H10D 86/40* | (2025.01) |
| *H10D 86/60* | (2025.01) |

(52) U.S. Cl.
CPC .............. *H10D 86/60* (2025.01); *G09G 3/32* (2013.01); *H10D 30/6743* (2025.01); *H10D 30/6755* (2025.01); *H10D 86/423* (2025.01); *H10D 86/441* (2025.01); *H10D 86/471* (2025.01); *G09G 2300/0819* (2013.01); *G09G 2300/0842* (2013.01)

(58) Field of Classification Search
CPC .. H10D 86/60; H10D 86/0231; H10D 86/443; H10D 86/441; H10D 86/471; H10D 86/423; H10D 86/40; H10D 30/6743; H10D 30/67; H10D 30/6755; G09G 3/32; G09G 2300/0819; G09G 3/323; G09G 3/20; G09G 3/36; G09G 3/3225; G09G 3/3648; G09G 3/367; G09G 3/3696; G09G 2300/0842; G09G 2300/0426; G09G 2300/08; G09G 2330/028; G09F 9/30; G09F 9/33; G09F 9/00
See application file for complete search history.

(56) References Cited

U.S. PATENT DOCUMENTS 9,189,991 B2     11/2015   Ka et al.

FOREIGN PATENT DOCUMENTS

| | | |
|---|---|---|
| KR | 10-1863322 | 5/2018 |
| KR | 10-2021-0042880 | 4/2021 |
| KR | 10-2021-0099243 | 8/2021 |

*Primary Examiner* — Nikolay K Yushin
(74) *Attorney, Agent, or Firm* — Harness, Dickey & Pierce, P.L.C.

(57) ABSTRACT

A display device includes a transistor disposed on a substrate and including a first active pattern, a second active pattern electrically connected to the transistor, a first line disposed on the second active pattern, and a second line disposed under the second active pattern and partially overlapping the first line.

19 Claims, 12 Drawing Sheets

CL1+SL1+CL2+CL3+SL2+CL4+CL5

F I G .  1 1
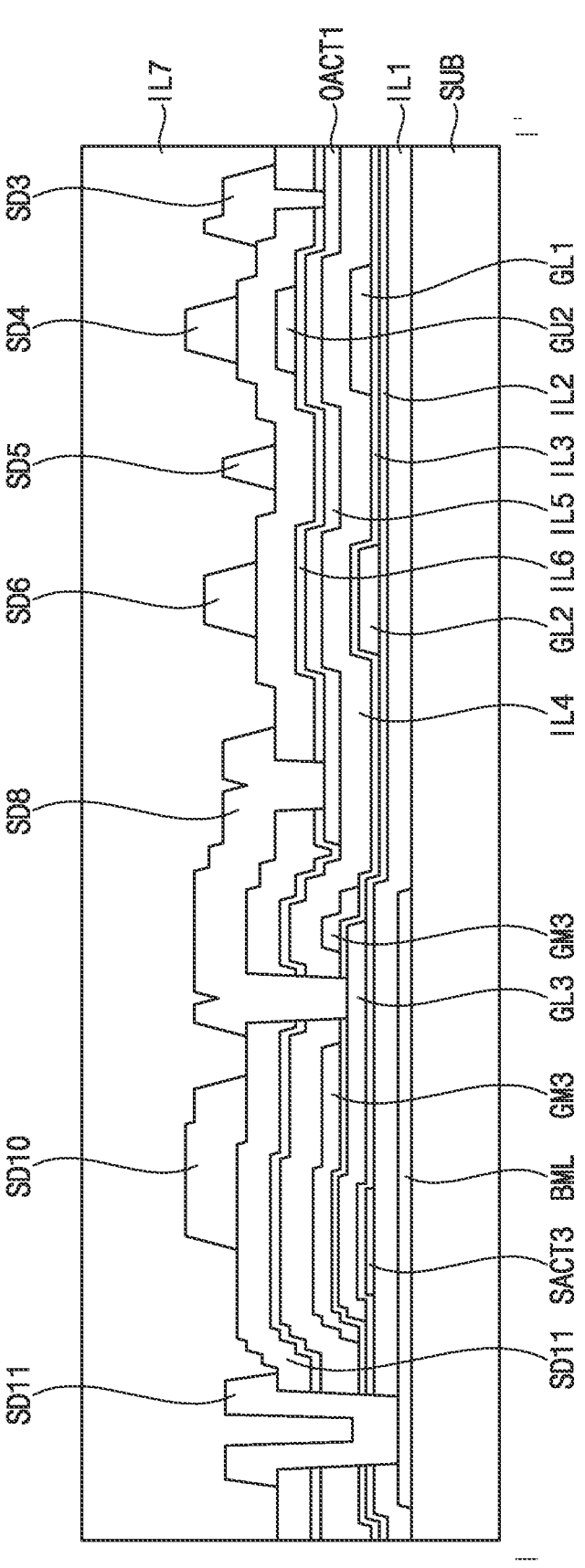

DISPLAY DEVICE AND METHOD OF DRIVING THE SAME

CROSS-REFERENCE TO RELATED APPLICATION(S)

This application claims priority to and benefits of Korean Patent Application No. 10-2022-0073594 under 35 U.S.C. § 119, filed on Jun. 16, 2022 in the Korean Intellectual Property Office (KIPO), the entire contents of which are hereby incorporated by reference.

BACKGROUND

1. Technical Field

Embodiments relate to a display device capable of displaying an image and a method of driving the same.

2. Description of the Related Art

A display device is manufactured and used in various ways. The display device may provide visual information to the user by emitting light. In order to emit light, the display device may include various light emitting elements. For example, the display device may include a liquid crystal display that emits light using a liquid crystal layer, an inorganic light emitting display that emits light using an inorganic light emitting diode, an organic light emitting display that emits light using an organic light emitting diode, or the like.

Recently, research for improving the performance of the display device has been conducted.

SUMMARY

Embodiments provide a display device capable of displaying an image.

A display device according to embodiments of the disclosure may include a transistor disposed on a substrate and including a first active pattern, a second active pattern electrically connected to the transistor, a first line disposed on the second active pattern, and a second line disposed under the second active pattern and partially overlapping the first line.

In an embodiment, a first signal having a high voltage level may be applied to the first line, and a second signal having a low voltage level may be applied to the second line.

In an embodiment, a signal applied to the second line may fall from a high voltage level to a low voltage level during a period in which a signal applied to the first line has a high voltage level.

In an embodiment, a portion of the second line may overlap both the first line and the second active pattern.

In an embodiment, the display device may further include a third line disposed on a same layer as the first line. The third line may be electrically connected to the second line.

In an embodiment, the display device may further include a third line disposed on a same layer as the first line and to which an initialization voltage is applied. The third line may be electrically connected to the second active pattern.

In an embodiment, the first active pattern may include a silicon-based semiconductor material, and the second active pattern may include an oxide-based semiconductor material.

In an embodiment, the display device may further include a third line disposed on a same layer as the first line, and a fourth line disposed on a same layer as the first line and to which an initialization voltage is applied. The third line may be electrically connected to the second line, and the fourth line may be electrically connected to the second active pattern.

In an embodiment, the display device may further include a light emitting element electrically connected to the transistor.

A display device according to embodiments of the disclosure may include a transistor disposed on a substrate and including a first active pattern, a second active pattern electrically connected to the transistor and including an oxide-based semiconductor material, a first line disposed on the second active pattern and to which a signal of a first level is applied, and a second line disposed under the second active pattern, to which a signal of a second level different from the first level is applied, the second line partially overlapping both the first line and the second active pattern.

In an embodiment, the signal applied to the first line may form a negative field, and the signal applied to the second line may form a positive field.

In an embodiment, the display device may further include a third line disposed on a same layer as the first line. The third line may be electrically connected to the second line.

In an embodiment, the display device may further include a third line disposed on a same layer as the first line and to which an initialization voltage is applied. The third line may be electrically connected to the second active pattern.

In an embodiment, the first active pattern may include a silicon-based semiconductor material.

In an embodiment, the display device may further include a third line disposed on a same layer as the first line, and a fourth line disposed on a same layer as the first line and to which an initialization voltage is applied. The third line may be electrically connected to the second line and the fourth line may be electrically connected to the second active pattern.

In an embodiment, the display device may further include a light emitting element electrically connected to the transistor.

In a method of driving a display device according to embodiments of the disclosure, the display device may include a substrate, a transistor disposed on the substrate and including a first active pattern, a second active pattern electrically connected to the transistor, a first line disposed on the second active pattern and to which a first signal of a high voltage level is applied, and a second line disposed under the second active pattern, to which a second signal of a low voltage level is applied, and partially overlapping the first line. The method may include applying a signal to the first line, and applying a signal to the second line. The signal applied to the second line may fall from a high voltage level to a low voltage level during a period in which the signal applied to the first line has a high voltage level.

In an embodiment, the first active pattern may include a silicon-based semiconductor material, and the second active pattern may include an oxide-based semiconductor material.

In an embodiment, the display device may further include a third line disposed on a same layer as the first line, and a fourth line disposed on a same layer as the first line and to which an initialization voltage is applied. The third line may be electrically connected to the second line, and the fourth line may be electrically connected to the second active pattern.

In order to achieve the above aspect of the disclosure, a display device may include a substrate, a transistor disposed on the substrate and including a first active pattern, a second active pattern connected to the transistor, a first line disposed on the second active pattern, and a second line disposed under the second active pattern and partially overlapping the first line.

Signals of different levels may be applied to the first line and the second line to form a positive field and a negative field, respectively. Accordingly, prevention of the resistance of the second active pattern from increasing may be possible.

BRIEF DESCRIPTION OF THE DRAWINGS

Illustrative, non-limiting embodiments will be more clearly understood from the following detailed description in conjunction with the accompanying drawings.

FIG. 11 is a schematic cross-sectional view illustrating an embodiment taken along line I-I' of FIG. 10.

DETAILED DESCRIPTION OF THE EMBODIMENTS

Figure 1:
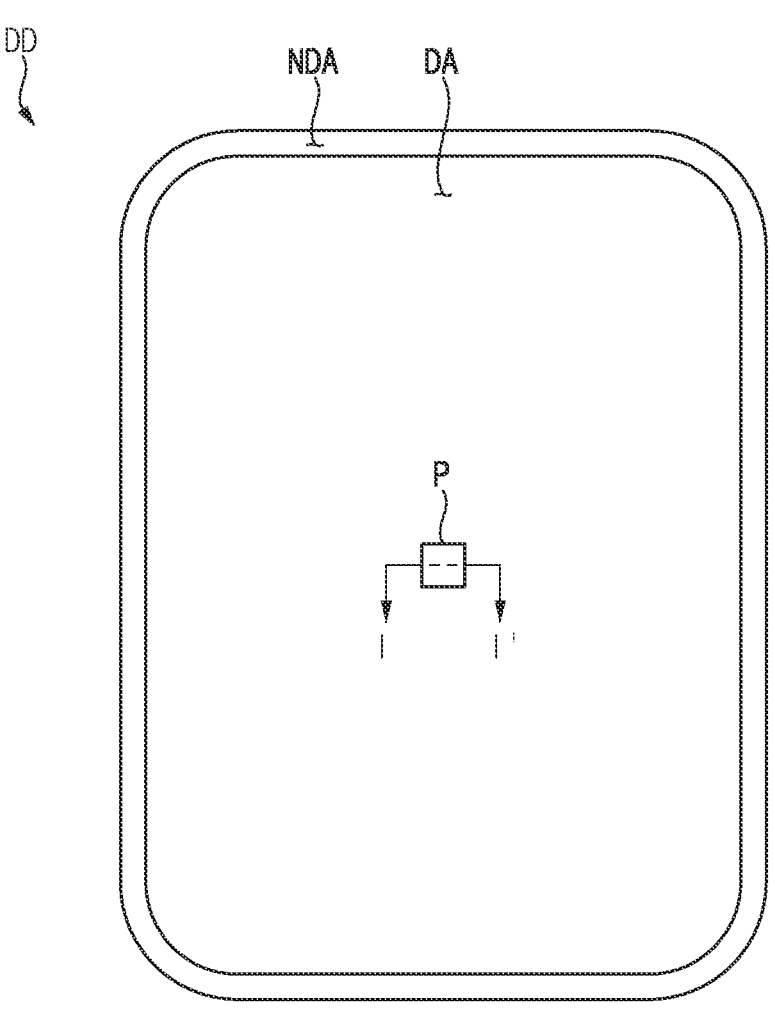
FIG. 1 is a schematic plan view illustrating a display device according to an embodiment.

Hereinafter, a display device according to embodiments of the disclosure will be explained in detail with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numerals are used for the same components in the drawings, and redundant descriptions of the same components will be omitted.

In the drawings, sizes, thicknesses, ratios, and dimensions of the elements may be exaggerated for ease of description and for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device DD may include a display area DA and a non-display area NDA. The display area DA may be defined as an area emitting light, and the non-display area NDA may be defined as an area in which components for transmitting signals transmitted to the display area DA are disposed.

Pixels P may be disposed in the display area DA. Each of the pixels P may include driving elements and a light emitting element connected to the driving elements. The driving elements may constitute a pixel circuit. The pixels P may emit light based on a signal transmitted from the non-display area NDA. The pixels P may be generally disposed in the display area DA. Accordingly, the display area DA may display an image by emitting light from an entire area.

Drivers may be disposed in the non-display area NDA. The drivers may generate and transmit signals for driving the pixels P, such as a gate signal, a light emitting signal, a data signal, a high power voltage, a low power voltage, an initialization voltage, and the like.

Figure 2A:
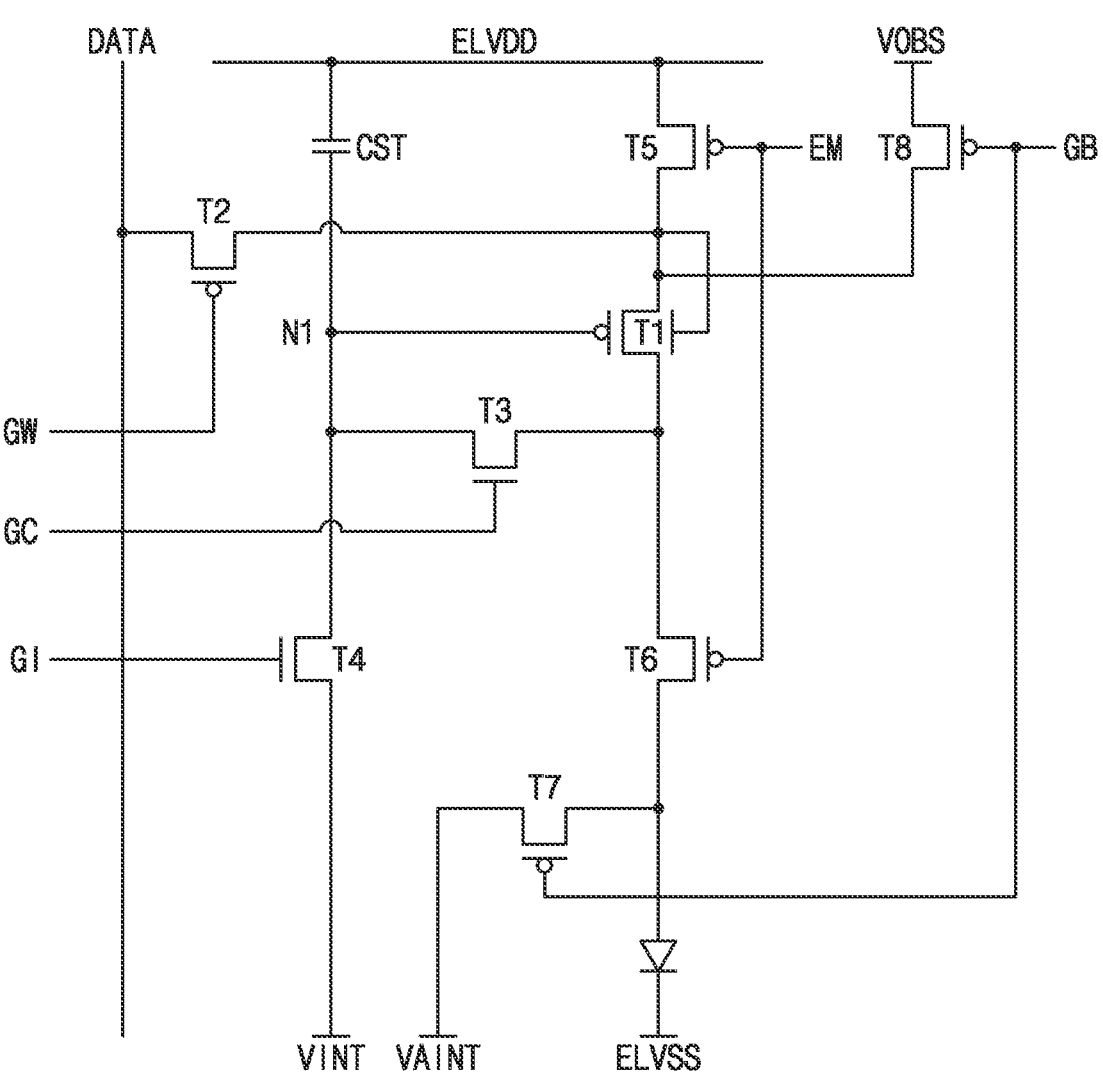
FIG. 2A is a schematic circuit diagram illustrating an embodiment of a pixel included in the display device of FIG. 1.

FIG. 2A is a schematic circuit diagram illustrating an embodiment of a pixel included in the display device of FIG. 1.

Referring to FIGS. 1 and 2A, each of the pixels P may include transistors T1, T2, T3, T4, T5, T6, T7, and T8, a capacitor CST, and a light emitting element.

The first transistor T1 may include a first terminal, a second terminal, and gate terminals. The first terminal of the first transistor T1 may be connected to the fifth transistor T5. A data signal DATA may be applied to the gate terminals of the first transistor T1. The second terminal of the first transistor T1 may be connected to the sixth transistor T6.

The second transistor T2 may include a first terminal, a second terminal, and a gate terminal. A data signal DATA may be applied to the first terminal of the second transistor T2. A first gate signal GW may be applied to the gate terminal of the second transistor T2. The second terminal of the second transistor T2 may be connected to the first terminal of the first transistor T1.

The third transistor T3 may include a first terminal, a second terminal, and a gate terminal. The first terminal of the third transistor T3 may be connected to gate terminals of the first transistor T1. A second gate signal GC may be applied to the gate terminal of the third transistor T3. The second terminal of the third transistor T3 may be connected to the second terminal of the first transistor T1.

The fourth transistor T4 may include a first terminal, a second terminal, and a gate terminal. The first terminal of the fourth transistor T4 may be connected to gate terminals of the first transistor T1. A third gate signal GI may be applied to the gate terminal of the fourth transistor T4. A first initialization voltage VINT may be applied to the second terminal of the fourth transistor T4.

The fifth transistor T5 may include a first terminal, a second terminal, and a gate terminal. A high power voltage ELVDD may be applied to the first terminal of the fifth transistor T5. A light emitting signal EM may be applied to the gate terminal of the fifth transistor T5. The second terminal of the fifth transistor T5 may be connected to the first terminal of the first transistor T1.

The sixth transistor T6 may include a first terminal, a second terminal, and a gate terminal. The first terminal of the sixth transistor T6 may be connected to the second terminal of the first transistor T1. The light emitting signal EM may be applied to the gate terminal of the sixth transistor T6. The second terminal of the sixth transistor T6 may be connected to the light emitting element.

The seventh transistor T7 may include a first terminal, a second terminal, and a gate terminal. A second initialization voltage VAINT may be applied to the first terminal of the seventh transistor T7. A fourth gate signal GB may be applied to the gate terminal of the seventh transistor T7. The second terminal of the seventh transistor T7 may be connected to the light emitting element.

The eighth transistor T8 may include a first terminal, a second terminal, and a gate terminal. A bias voltage VOBS may be applied to the first terminal of the eighth transistor T8. The fourth gate signal GB may be applied to the gate terminal of the eighth transistor T8. The second terminal of the eighth transistor T8 may be connected to the first terminal of the first transistor T1.

Each of the first transistor T1, the second transistor T2, and the fifth to eighth transistors T4, T5, T6, T7, and T8 may be implemented as a PMOS transistor, and each of the third and fourth transistors T3 and T4 may be implemented as an NMOS transistor. However, the disclosure is not limited thereto. For example, each of the first transistor T1, the second transistor T2, the fifth transistor T5, the sixth transistor T6, and the eighth transistor T8 may be implemented as a PMOS transistor, and each of the third transistor T3, the fourth transistor T4, and the seventh transistor T7 may be implemented as an NMOS transistor.

The light emitting element may include a first terminal and a second terminal. The first terminal of the light emitting element may be connected to a sixth transistor T6 and a seventh transistor T7. A low power voltage ELVSS may be applied to the second terminal of the light emitting element.

The capacitor CST may include a first terminal and a second terminal. The high power voltage ELVDD may be applied to the first terminal of the capacitor CST, and the second terminal of the capacitor CST may be connected to the gate terminal of the first transistor T1.

Figure 2B:
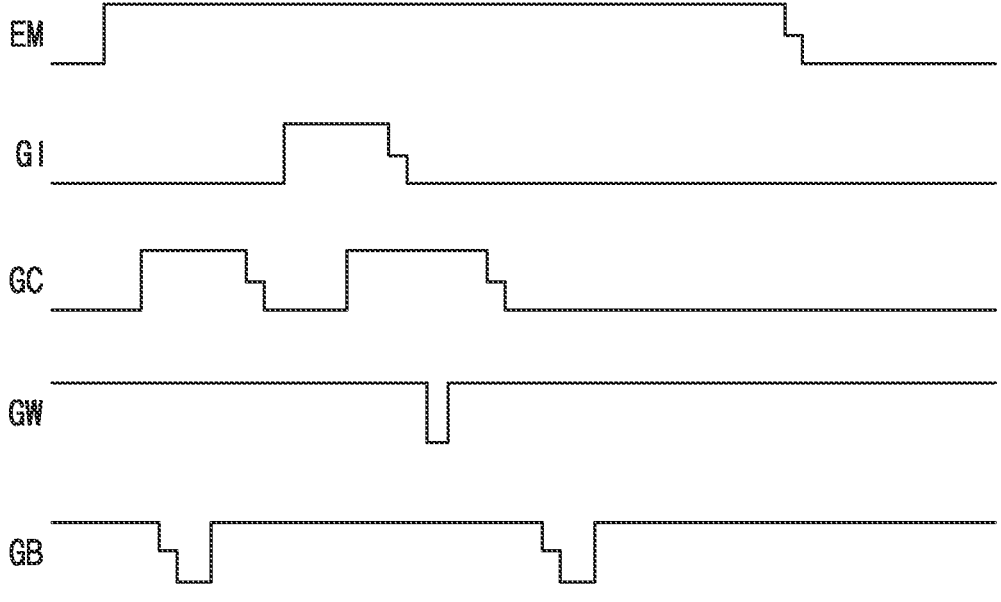
FIG. 2B is a schematic signal diagram according to an embodiment.

FIG. 2B is a schematic signal diagram according to an embodiment.

Referring to FIG. 2B, the light emitting signal EM and the first to fourth gate signals GW, GC, GI, and GB may be applied at different timings.

FIGS. 3, 4, 5, 6, 7, 8, 9, and 10 are schematic layout diagrams illustrating an embodiment of the structure of the pixel of FIG. 1.

Figure 3:
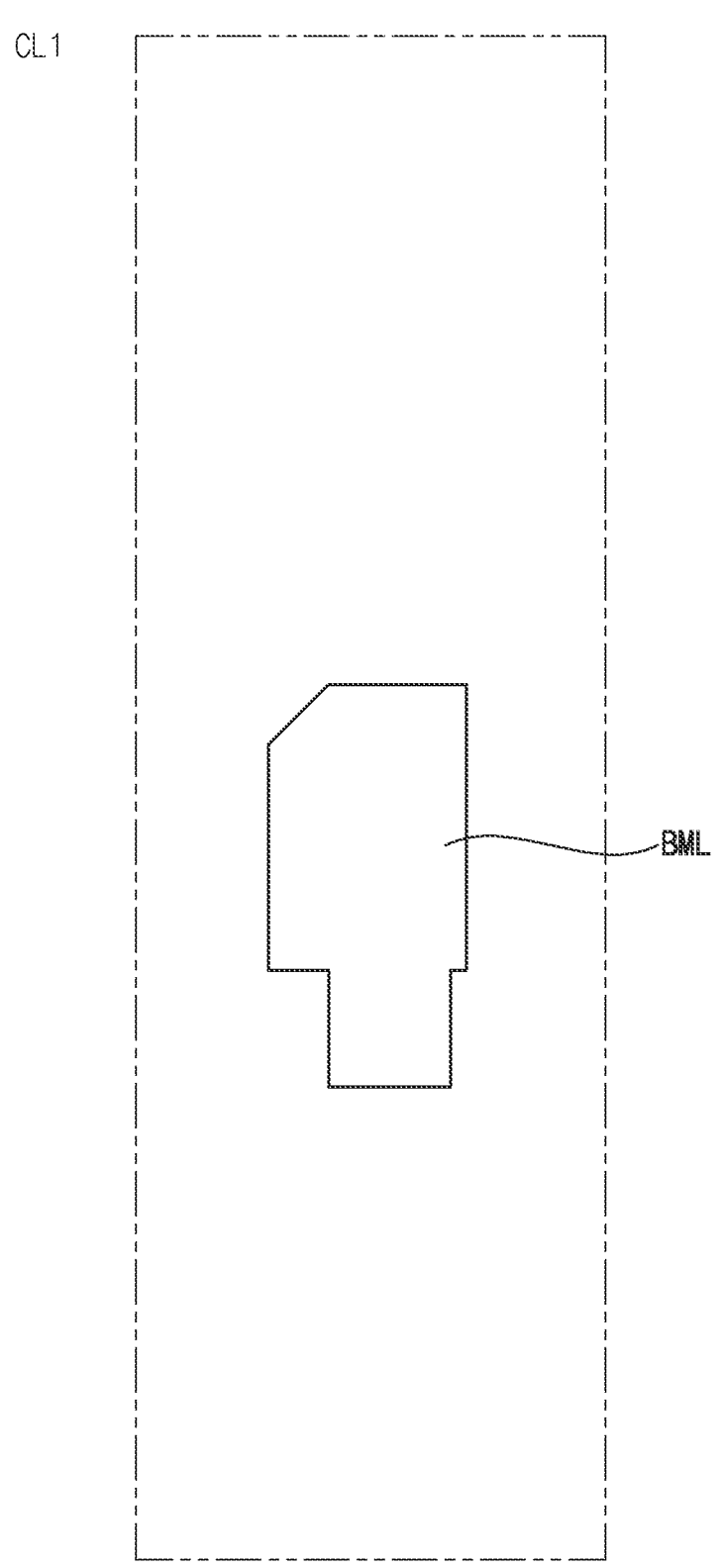
FIGS. 3, 4, 5, 6, 7, 8, 9, and 10 are schematic layout diagrams illustrating an embodiment of the structure of the pixel of FIG. 1.

Referring to FIG. 3, the display device DD may include a first conductive layer CL1. The first conductive layer CL1 may include a lower line BML. The first conductive layer CL1 may include a metal, an alloy, a metal oxide, a transparent conductive material, and/or the like. Examples of the material that can be used as the first conductive layer CL1 may include silver ("Ag"), an alloy containing silver, molybdenum ("Mo"), an alloy containing molybdenum, aluminum ("Al"), and aluminum containing alloy, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other.

Figure 4:
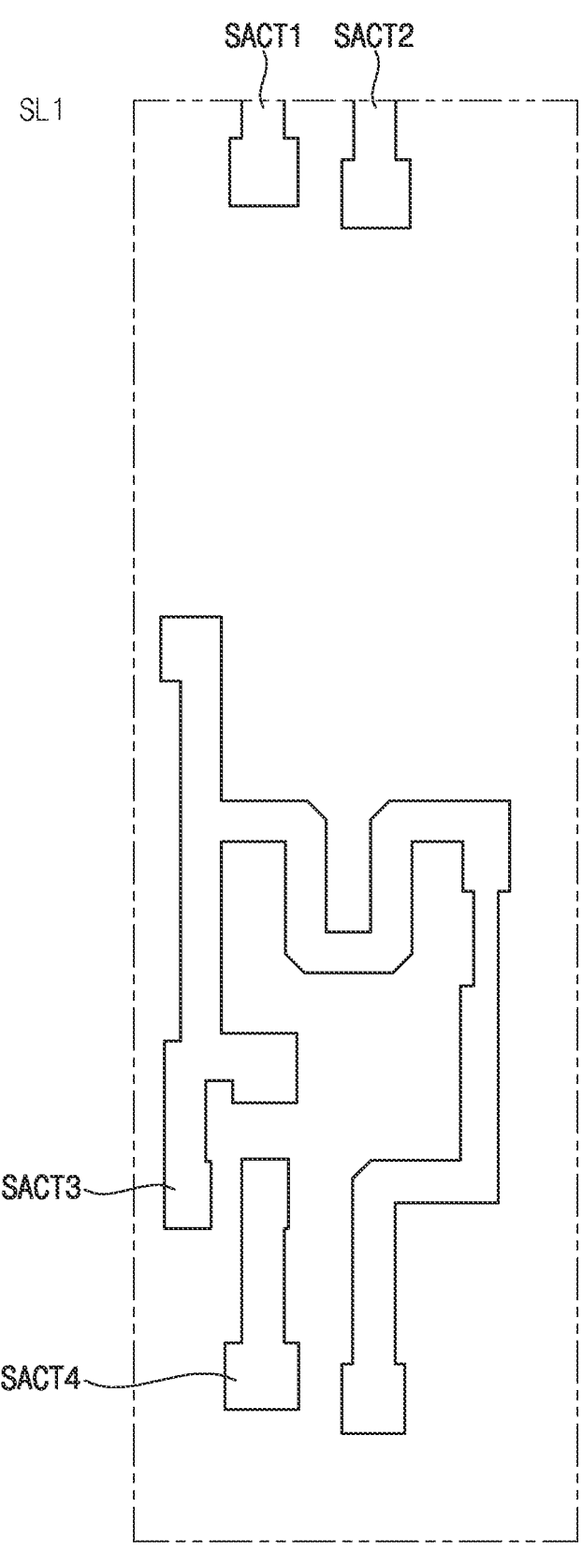

Referring to FIG. 4, the display device DD may further include a first semiconductor layer SL1. The first semiconductor layer SL1 may include active patterns SACT1, SACT2, SACT3, SACT4. The active patterns SACT1, SACT2, SACT3, SACT4 may be defined as first to fourth lower active patterns SACT1, SACT2, SACT3, SACT4. A pixel (or sub-pixel) constituted by the first and second lower active patterns SACT1 and SACT2 may be different from a pixel (or sub-pixel) constituted by the third and fourth lower active patterns SACT3 and SACT4. The first semiconductor layer SL1 may include a silicon-based semiconductor material. Examples of the silicon-based semiconductor material may include amorphous silicon, polycrystalline silicon, and/or the like.

Figure 5:
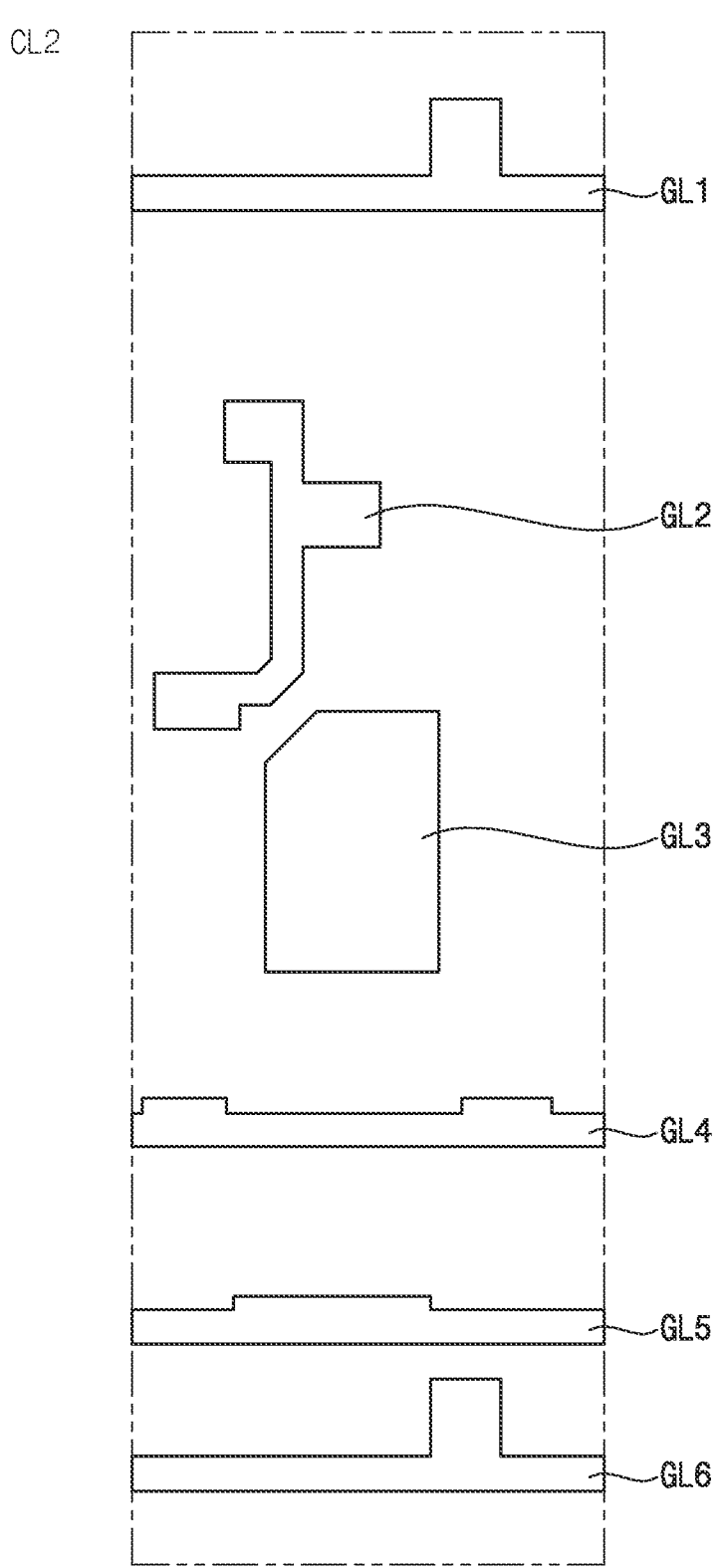

Referring to FIGS. 2 and 5, the display device DD may further include a second conductive layer CL2. The second conductive layer CL2 may include gate lines GL1, GL2, GL3, GL4, GL5, and GL6. The gate lines GL1, GL2, GL3, GL4, GL5, and GL6 may be respectively defined as lower gate lines GL1, GL2, GL3, GL4, GL5, and GL6. The second initialization voltage VAINT may be applied to the first lower gate line GL1. The light emission signal EB may be applied to the fourth lower gate line GL4. The fourth gate signal GB may be applied to the fifth lower gate line GL5. The second initialization voltage VAINT may be applied to the sixth lower gate line GL6. A pixel (or sub-pixel) constituted by the first lower gate line GL1 may be different from a pixel (or sub-pixel) constituted by the second to sixth lower gate lines GL2, GL3, GL4, GL5, and GL6. The second conductive layer CL2 may include a metal, an alloy, a metal oxide, a transparent conductive material, and/or the like. Examples of the material that may be used as the second conductive layer CL2 may include silver ("Ag"), an alloy containing silver, molybdenum ("Mo"), an alloy containing molybdenum, aluminum ("Al"), and aluminum containing alloy, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other.

Figure 6:
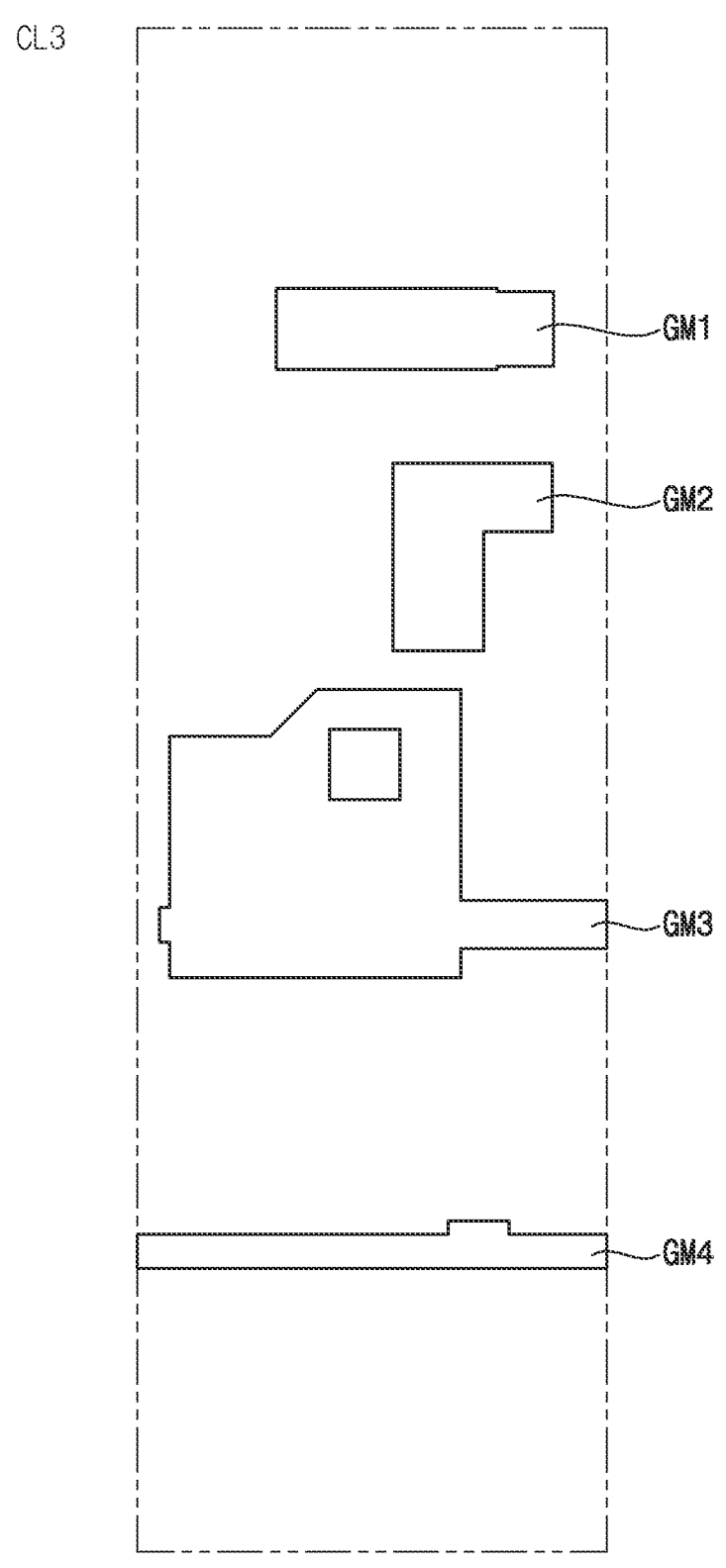

Referring to FIG. 6, the display device DD may further include a third conductive layer CL3. The third conductive layer CL3 may include gate lines GM1, GM2, GM3, and GM4. The gate lines GM1, GM2, GM3, and GM4 may be defined as intermediate gate lines GM1, GM2, GM3, and GM4, respectively. The fourth intermediate gate line GM4 may correspond to a floating line. The third conductive layer CL3 may include a metal, an alloy, a metal oxide, a transparent conductive material, and/or the like. Examples of the material that can be used as the third conductive layer CL3 may include silver ("Ag"), an alloy containing silver, molybdenum (Mo), an alloy containing molybdenum, aluminum ("Al"), and aluminum containing alloy, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum (Pt), scandium ("Sc"), indium tin oxide ("ITO"), indium zinc oxide ("IZO"), and the like. These may be used alone or in combination with each other.

Figure 7:
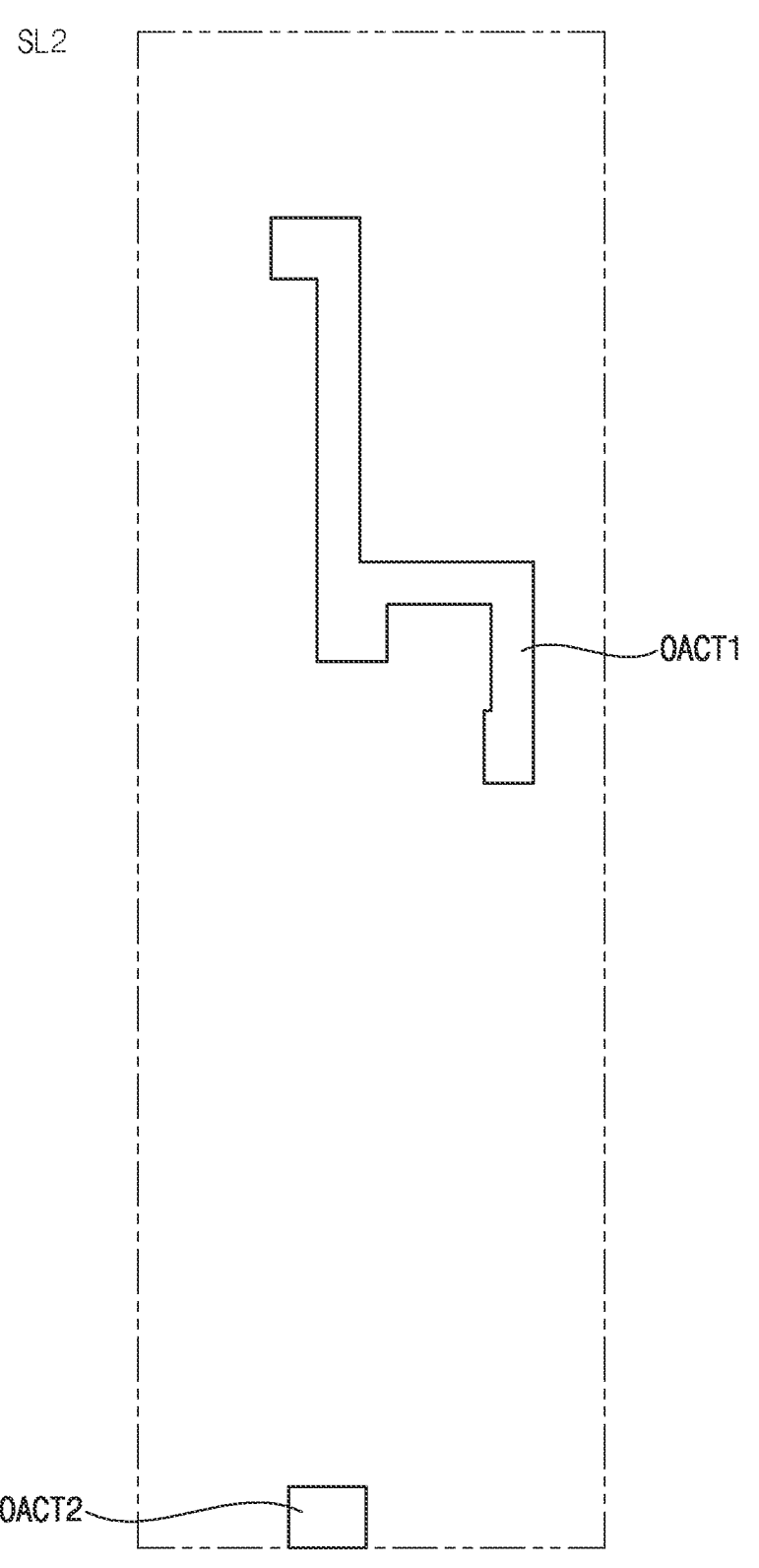

Referring to FIG. 7, the display device DD may further include a second semiconductor layer SL2. The second semiconductor layer SL2 may include active patterns OACT1 and OACT2. The active patterns OACT1 and OACT2 may be defined as first and second upper active patterns OACT1 and OACT2. The first and second upper active patterns OACT1 and OACT2 may constitute different pixels. The first semiconductor layer SL1 may include an oxide-based semiconductor material. Examples of the oxide-based semiconductor material may include indium-gallium-zinc oxide ("IGZO"), indium-gallium oxide ("IGO"), indium-zinc oxide ("IZO"), and/or the like.

Figure 8:
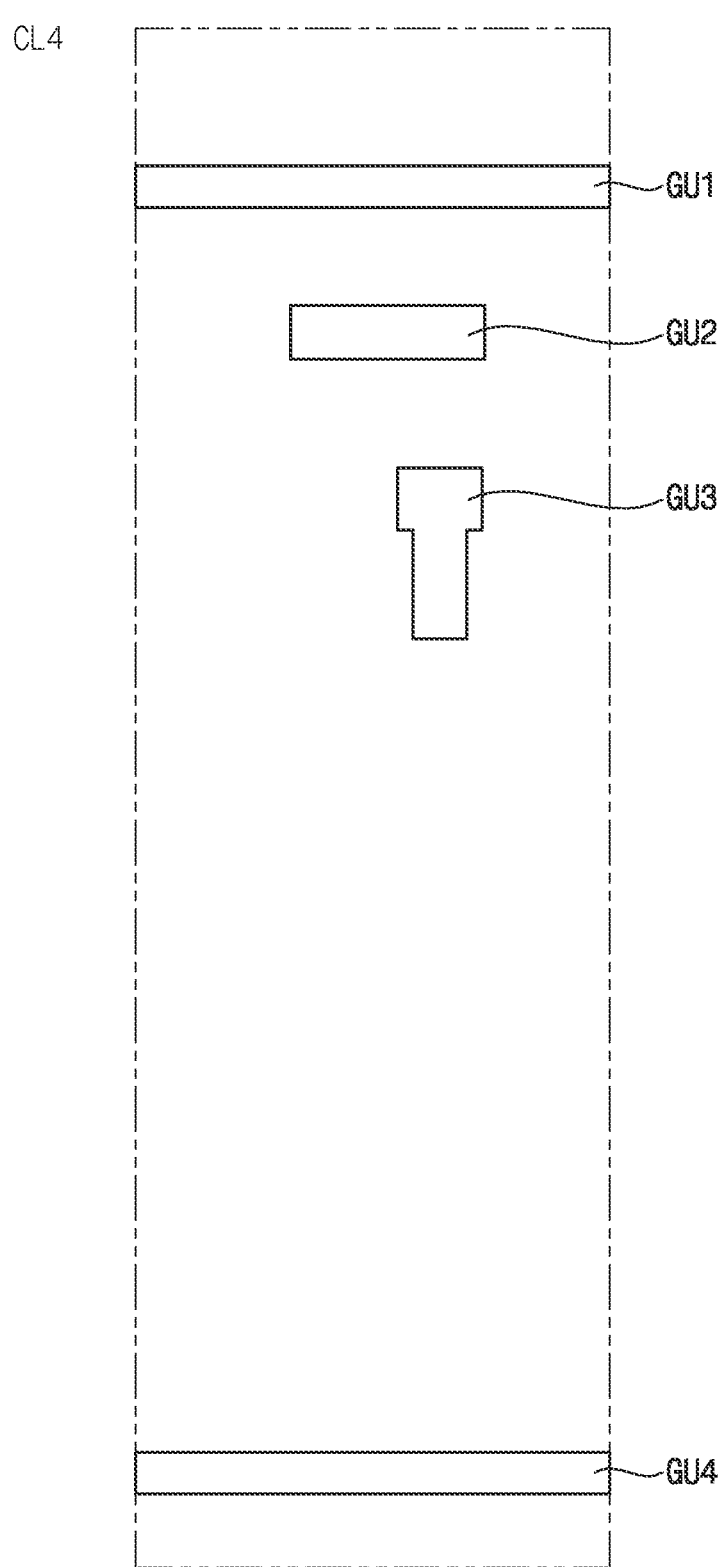

Referring to FIG. 8, the display device DD may further include a fourth conductive layer CL4. The fourth conductive layer CL4 may include gate lines GU1, GU2, GU3, and GU4. The gate lines GU1, GU2, GU3, and GU4 may be defined as upper gate lines GU1, GU2, GU3, and GU4, respectively. The second initialization voltage VAINT may be applied to the first upper gate line GU1. The second initialization voltage VAINT may be applied to the fourth upper gate line GU4. A pixel (or sub-pixel) constituted by the first upper gate line GU1 may be different from a pixel (or sub-pixel) constituted by the second to fourth upper gate lines GU1, GU2, GU3, and GU4. The fourth conductive layer CL4 may include a metal, an alloy, a metal oxide, a transparent conductive material, and/or the like. Examples of the material that can be used as the fourth conductive layer CL4 may include silver ("Ag"), an alloy containing silver, molybdenum ("Mo"), an alloy containing molybdenum, aluminum ("Al"), and aluminum containing alloy, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other.

Figure 9:
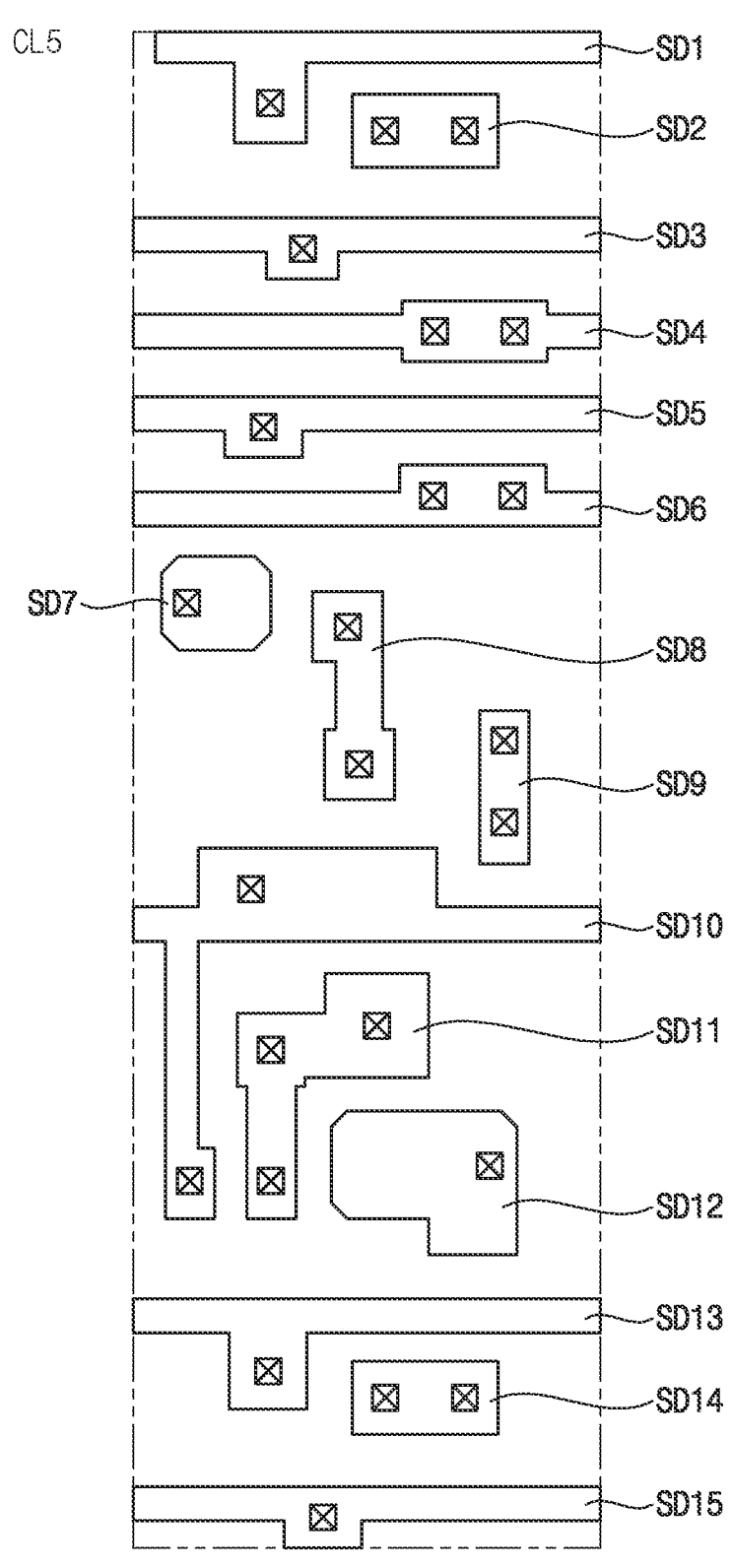

Referring to FIGS. 2 and 9, the display device DD may further include a fifth conductive layer CL5. The fifth conductive layer CL5 may include SD lines SD1, SD2, SD3, SD4, SD5, SD6, SD7, SD8, SD9, SD10, SD11, SD12, SD13, SD14, and SD15. The bias voltage VOBS may be applied to the first SD line SD1. The first initialization voltage VINT may be applied to the third SD line SD3. The third gate signal GI may be applied to the fourth SD wiring SD4. The first gate signal GW may be applied to the fifth SD line SD5. The second gate signal GC may be applied to the sixth SD line SD6. The high power voltage ELVDD may be applied to the tenth SD line SD10. The bias voltage VOBS may be applied to the thirteenth SD line SD13. The first initialization voltage VINT may be applied to the fifteenth SD line SD15. A pixel (or sub-pixel) constituted by the first and fifteenth SD lines SD1 and SD15 may be different from a pixel (or sub-pixel) constituted by the second to fourteenth SD lines SD2, SD3, SD4, SD5, SD6, SD7, SD8, SD9, SD10, SD11, SD12, SD13, SD14, and SD15. The fifth conductive layer CL5 may include a metal, an alloy, a metal oxide, a transparent conductive material, and/or the like. Examples of the material that can be used as the fifth conductive layer CL5 may include silver ("Ag"), an alloy containing silver, molybdenum ("Mo"), an alloy containing molybdenum, aluminum ("Al"), and aluminum containing alloy, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used alone or in combination with each other.

Figure 10:
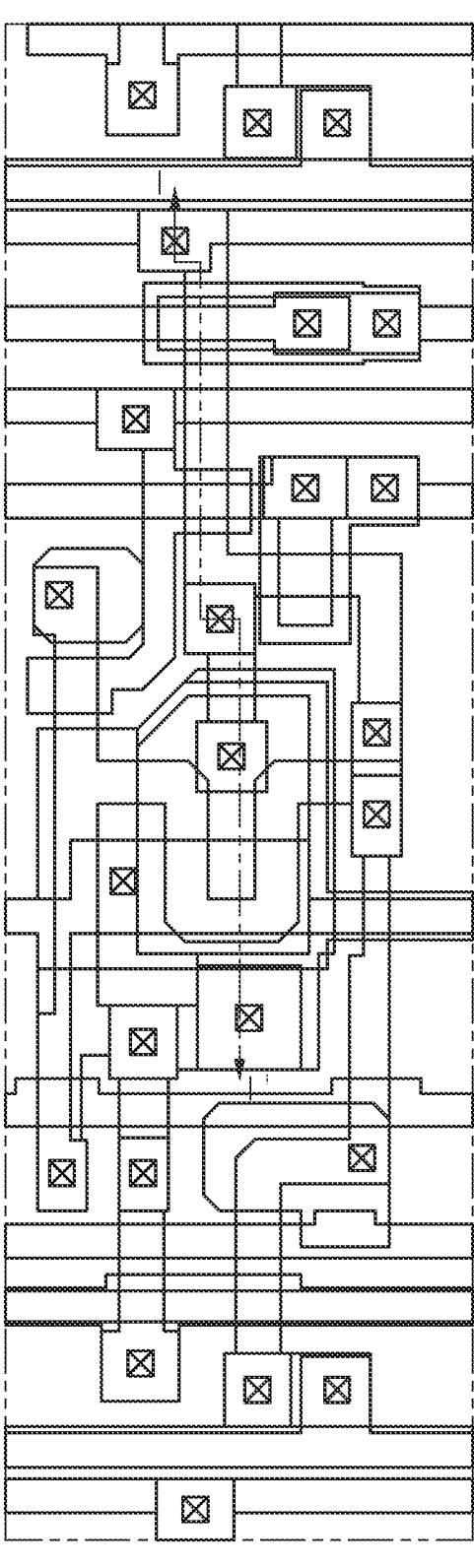

FIG. 10 may correspond to a diagram illustrating a structure in which the first conductive layer CL1, the first semiconductor layer SL1, the second conductive layer CL2, the third conductive layer CL3, the second semiconductor layer SL2, the fourth conductive layer CL4 and the fifth conductive layer CL5 are sequentially stacked on each other. Each of the lines may be connected to other lines by a contact hole (shown as an X-box).

FIG. 11 is a schematic cross-sectional view illustrating an embodiment taken along line I-I' of FIG. 10.

Referring to FIGS. 2 and 11, the display device DD may include a substrate SUB, the lower line BML, a first insulating layer ILL the third lower active pattern ACT3, a second insulating layer IL2, the second lower gate line GL2, the third lower gate line GL3, a third insulating layer IL3, the first intermediate gate line GM1, the third intermediate gate line GM3, a fourth insulating layer IL4, the first upper active pattern OACT1, a fifth insulating layer IL5, the second upper gate line GU2, a sixth insulating layer IL6, the third to sixth SD lines SD3, SD4, SD5, and SD6, the eighth SD line SD8, the tenth and eleventh SD lines SD10 and SD11, and a seventh insulating layer IL7.

The substrate SUB may include a rigid material or a flexible material. The rigid material may include glass, and the flexible material may include a polymer material such as polyimide.

The lower line BML may be disposed on the substrate SUB. The first insulating layer IL1 may be disposed on the substrate SUB to cover the lower line BML. The first insulating layer IL1 may include an inorganic insulating material. Examples of the material that can be used as the inorganic insulating material may include silicon oxide, silicon nitride, silicon oxynitride, and the like. These may be used alone or in combination with each other.

The third lower active pattern SACT3 may be disposed on the first insulating layer IL1. The third lower active pattern SACT3 may be disposed to overlap the lower interconnection BML.

The second insulating layer IL2 may be disposed to cover the third lower active pattern SACT3. The second insulating layer IL2 may include an inorganic insulating material. Examples of the material that can be used as the inorganic insulating material include silicon oxide, silicon nitride, silicon oxynitride, and the like. These may be used alone or in combination with each other.

The second lower gate line GL2 and the third lower gate line GL3 may be disposed on the second insulating layer IL2. The third lower gate line GL3 may be disposed to overlap the third lower active pattern SACT3.

The third insulating layer IL3 may be disposed to cover the second lower gate line GL2 and the third lower gate line GL3. The third insulating layer IL3 may include an inorganic insulating material. Examples of the material that can be used as the inorganic insulating material may include silicon oxide, silicon nitride, silicon oxynitride, and the like. These may be used alone or in combination with each other.

The first intermediate gate line GM1 and the third intermediate gate line GM3 may be disposed on the third insulating layer IL3. The third intermediate gate line GM3 may be disposed to overlap the third lower gate line GL3. The third intermediate gate line GM3 and the third lower gate line GL3 may constitute the capacitor CST.

The fourth insulating layer IL4 may be disposed to cover the first intermediate gate line GM1 and the third intermediate gate line GM3. The fourth insulating layer IL4 may include an inorganic insulating material. Examples of the material that can be used as the inorganic insulating material may include silicon oxide, silicon nitride, silicon oxynitride, and the like. These may be used alone or in combination with each other.

The first upper active pattern OACT1 may be disposed on the fourth insulating layer IL4. The first upper active pattern OACT1 may overlap the second lower gate line GL2 and the first intermediate gate line GM1.

The fifth insulating layer IL5 may be disposed to cover the first upper active pattern OACT1. The fifth insulating layer IL5 may include an inorganic insulating material. Examples of the material that can be used as the inorganic insulating material include silicon oxide, silicon nitride, silicon oxynitride, and the like. These may be used alone or in combination with each other.

The second upper gate line GU2 may be disposed on the fifth insulating layer IL5. The second upper gate line GU2 may be disposed to overlap the first intermediate gate line GM1 and the first upper active pattern OACT1.

The sixth insulating layer IL6 may be disposed to cover the second upper gate line GU2. The sixth insulating layer IL6 may include an inorganic insulating material. Examples of the material that can be used as the inorganic insulating material may include silicon oxide, silicon nitride, silicon oxynitride, and the like. These may be used alone or in combination with each other.

The third to sixth SD lines SD3, SD4, SD5, and SD6, the eighth SD line SD8, the tenth SD line SD10, and the eleventh SD line SD11 may be disposed on the sixth insulating layer IL6. The third SD line SD3 may be electrically connected to the first upper active pattern OACT1 by a contact hole. The first initialization voltage VINT may be applied to the third SD line SD3. The fourth SD line SD4 may overlap the second upper gate line GU2. The third gate signal GI may be applied to the fourth SD line SD4. The fifth SD line SD5 may be disposed to overlap the first upper active pattern OACT1. The first gate signal GW may be applied to the fifth SD line SD5. The sixth SD line SD6 may overlap the second lower gate line GL2 and the first upper active pattern OACT1. A second gate signal GC may be applied to the sixth SD line SD6. The first gate signal GW may be applied to the second lower gate line GL2. The second lower gate line GL2 and the fifth SD line SD5 may be electrically connected to each other as illustrated in FIG. 10. The same signal may be applied to the second lower gate line GL2 and the fifth SD line SD5.

At this time, signals of different levels may be applied to the second lower gate line GL2 and the sixth SD line SD6. For example, referring to FIG. 2B together, when the second gate signal GC applied to the sixth SD line SD6 has a high voltage level, the first gate signal GW applied to the second lower gate line GL2 may have a low voltage level. When the first initialization voltage VINT is applied to the first upper active pattern OACT1, the second gate signal GC applied to the sixth SD line SD6 may have a high voltage level. In this case, the resistance of the first upper active pattern OACT1 may increase by an electric field formed by the second gate signal GC. To prevent this, the first gate signal GW applied to the second lower gate line GL2 may fall from a high voltage level to a low voltage level. In this driving method, an increase in resistance of the first upper active pattern OACT1 by the sixth SD line SD6 may be prevented by using the second lower gate line GL2.

The eighth SD line SD8 may serve as a bridge connecting the first upper active pattern OACT1 and the third lower gate line GL3. The high power voltage ELVDD may be applied to the tenth SD line SD10. The eleventh SD wire SD11 may be electrically connected to the thirteenth SD wire SD13 as illustrated in FIG. 10. Accordingly, the bias voltage VOBS may be applied to the eleventh SD line SD11.

The seventh insulating layer IL7 may be disposed to cover the third to sixth SD lines SD3, SD4, SD5, and SD6, the eighth SD line SD8, the tenth SD line SD10, and the eleventh SD line SD11. The seventh insulating layer IL7 may include an organic insulating material. Examples of the material that can be used as the organic insulating material may include polyacrylic resins, polyimide-based resins, acrylic resins, and the like. These may be used alone or in combination with each other.

The disclosure can be applied to various display devices. For example, the disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure.

What is claimed is:

1. A display device comprising:
   a first active pattern disposed on a substrate;
   a lower gate line disposed on the first active pattern and overlapping the first active pattern;
   a second active pattern electrically connected to the lower gate line;
   a first line disposed on the second active pattern; and
   a second line disposed under the second active pattern and partially overlapping the first line.

2. The display device of claim 1, wherein
   a first signal having a high voltage level is applied to the first line, and
   a second signal having a low voltage level is applied to the second line.

3. The display device of claim 2, wherein a signal applied to the second line falls from a high voltage level to a low voltage level during a period in which a signal applied to the first line has a high voltage level.

4. The display device of claim 1, wherein a portion of the second line overlaps both the first line and the second active pattern.

5. The display device of claim 1, further comprising:
a third line disposed on a same layer as the first line,
wherein the third line is electrically connected to the second line.

6. The display device of claim 1, further comprising:
a third line disposed on a same layer as the first line and to which an initialization voltage is applied,
wherein the third line is electrically connected to the second active pattern.

7. The display device of claim 1, wherein
the first active pattern includes a silicon-based semiconductor material, and
the second active pattern includes an oxide-based semiconductor material.

8. The display device of claim 1, further comprising:
a third line disposed on a same layer as the first line; and
a fourth line disposed on the same layer as the first line and to which an initialization voltage is applied, wherein
the third line is electrically connected to the second line, and
the fourth line is electrically connected to the second active pattern.

9. The display device of claim 1, further comprising:
a light emitting element electrically connected to the first active pattern.

10. A display device comprising:
a first active pattern disposed on a substrate;
a lower gate line disposed on the first active pattern and overlapping the first active pattern;
a second active pattern electrically connected to the lower gate line and including an oxide-based semiconductor material;
a first line disposed on the second active pattern and to which a signal of a first level is applied; and
a second line disposed under the second active pattern, to which a signal of a second level different from the first level is applied, the second line partially overlapping both the first line and the second active pattern.

11. The display device of claim 10, wherein
the signal applied to the first line forms a negative field, and
the signal applied to the second line forms a positive field.

12. The display device of claim 10, further comprising:
a third line disposed on a same layer as the first line,
wherein the third line is electrically connected to the second line.

13. The display device of claim 10, further comprising:
a third line disposed on a same layer as the first line and to which an initialization voltage is applied, wherein the third line is electrically connected to the second active pattern.

14. The display device of claim 10, wherein the first active pattern includes a silicon-based semiconductor material.

15. The display device of claim 10, further comprising:
a third line disposed on a same layer as the first line; and
a fourth line disposed on the same layer as the first line and to which an initialization voltage is applied, wherein
the third line is electrically connected to the second line, and
the fourth line is electrically connected to the second active pattern.

16. The display device of claim 10, further comprising:
a light emitting element electrically connected to the first active pattern.

17. A method of driving a display device comprising a first active pattern disposed on a substrate, a lower gate line disposed on the first active pattern and overlapping the first active pattern, a second active pattern electrically connected to the lower gate line, a first line disposed on the second active pattern and to which a first signal of a high voltage level is applied, and a second line disposed under the second active pattern, to which a second signal of a low voltage level is applied, and partially overlapping the first line, the method comprising:
applying a signal to the first line; and
applying a signal to the second line, wherein
the signal applied to the second line falls from a high voltage level to a low voltage level during a period in which the signal applied to the first line has a high voltage level.

18. The method of claim 17, wherein
the first active pattern includes a silicon-based semiconductor material, and
the second active pattern includes an oxide-based semiconductor material.

19. The method of claim 17, wherein
the display device further includes:
a third line disposed on a same layer as the first line; and
a fourth line disposed on the same layer as the first line and to
which an initialization voltage is applied,
the third line is electrically connected to the second line, and
the fourth line is electrically connected to the second active pattern.

* * * * *